United States Patent
Moriceau et al.

(10) Patent No.: US 8,303,745 B2
(45) Date of Patent: Nov. 6, 2012

(54) PROCESS FOR TRANSFERRING FILMS

(75) Inventors: Hubert Moriceau, Saint Egreve (FR); Maurice Couchaud, Izeron (FR); Jean-Luc Deschanvres, Meylan (FR); Anne-Laure Joudrier, Vert-Saint-Denis (FR)

(73) Assignee: Commissariat a l'Energie Atomique, Paris (FR)

( * ) Notice: Subject to any disclaimer, the term of this patent is extended or adjusted under 35 U.S.C. 154(b) by 270 days.

(21) Appl. No.: 12/276,125

(22) Filed: Nov. 21, 2008

(65) Prior Publication Data
US 2009/0133811 A1 May 28, 2009

(30) Foreign Application Priority Data

Nov. 28, 2007 (FR) .................................. 07 59389

(51) Int. Cl.
*B32B 38/10* (2006.01)
(52) U.S. Cl. ................. 156/230; 156/272.2; 156/246; 156/115
(58) Field of Classification Search ............... 156/230, 156/246, 272.2; 438/407, 458; 117/3, 4, 117/915
See application file for complete search history.

(56) References Cited

U.S. PATENT DOCUMENTS

| | | | | |
|---|---|---|---|---|
| 5,163,118 A | * | 11/1992 | Lorenzo et al. | 385/132 |
| 6,120,597 A | | 9/2000 | Levy et al. | |
| 6,540,827 B1 | * | 4/2003 | Levy et al. | 117/3 |
| 7,615,421 B2 | * | 11/2009 | Lee et al. | 438/151 |
| 2004/0112866 A1 | | 6/2004 | Maleville et al. | |
| 2005/0201715 A1 | * | 9/2005 | Ellwood, Jr. | 385/147 |
| 2007/0042516 A1 | * | 2/2007 | Izuhara et al. | 438/21 |
| 2008/0232761 A1 | * | 9/2008 | Kumaran et al. | 385/142 |

OTHER PUBLICATIONS

"The Stopping and Range of Ions in Solids", by J. F. Ziegler, J. P. Biersack and U. Littmark, Pergamon Press, New York, 1985 and the contribution of J. F. Ziegler in www.SRIM.org. (5 pgs).
"Silicon Wafer Bonding Technology for VLSI and MEMS applications", by B. Aspar and A. J. Auberton-Hervé, edited by S. S. Iyer an A. J. Auberton- Hervé,, 2002, INSPEC, London, Chapter 3, pp. 35-52.
French Preliminary Search Report Dated Nov. 28, 2007 3-pages.
T. Izuhara et al., "Direct Wafer Bonding and Transfer of 10-[mu]m-Thick Magnetic Garnet Films Onto Semiconductor Surfaces", Applied Physics Letters, AIP, American Institute of Physics, Melville, NY, vol. 76, Mar. 6, 2000, pp. 1261-1263.
The contribution of J.F. Ziegler in www.SRIM.org., Nov. 25, 2008, 5 pages.
W. A. Johnson, J.C. North, and R. Wolfe: "Differential Etching of Ion-Implanted Garnet", J. Appl. Phys., vol. 44, Oct. 10, 1973, pp. 4753-4757.

(Continued)

*Primary Examiner* — Khanh P Nguyen
*Assistant Examiner* — Vishal I Patel
(74) *Attorney, Agent, or Firm* — Brinks Hofer Gilson & Lione

(57) ABSTRACT

A process of transferring a layer of a first material from a first substrate, having defects in a zone close to the surface, onto a host substrate made of a second material includes a step of thinning the first substrate in order to form a first thinned substrate, an ion or atom implantation in the first substrate in order to form an implantation plane therein, delimiting the layer to be transferred, and a transfer of the layer onto the host substrate by fracturing the substrate along the implantation plane.

21 Claims, 2 Drawing Sheets

OTHER PUBLICATIONS

F. J. Rachford et al., "Magnetization and FMR Studies of Crystal-Ion-Sliced Narrow Linedwidth Gallium-Doped Yttrium Iron Garnet", Journal of Applied Physics, vol. 87, No. 9, May 1, 2000, pp. 6253-6255.
U.S. District Court District of Delaware (Wilmington) Civil Docket for Case #: 1:08-cv-00292-SLR—(11 pgs).
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Nos. RE39,484 E; 6,809,009; 7,067,396 B2; (sns, ) (Entered: May 20, 2008) (1 pg).
Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon on Insulator Technologies SA, Commissariat a LEnergie Atomique. (Attachments: # 1 Certificate of Compliance Certification by Counsel to Be Admitted Pro Hac Vice, # 2 Certificate of Compliance Certification by Counsel to Be Admitted Pro Hac Vice, # 3 Certificate of Compliance Certification by Counsel to Be Admitted Pro Hac Vice, # 4 Certificate of Compliance Certification by Counsel to Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon on Insulator Technologies SA. (Attachments: # 1 Certification by Counsel to be Admitted Pro Hac Vice, # 2 Certification by Counsel to be Admitted Pro Hac Vice, # 3 Certification by Counsel to be Admitted Pro Hac Vice, # 4 Certification by Counsel to be Admitted Pro Hac Vice, # 5 Certification by Counsel to be Admitted Pro Hac Vice)(Kraft, Denise) (Entered: Jun. 10, 2008) (8 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc.. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc.. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a LEnergie Atomique.Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc.. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc.. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson—filed by MEMC Electronic Materials Inc.. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon on Insulator Technologies SA, Commissariat a LEnergie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc..(Rogowski, Patricia) (Entered: Mar. 6, 2009) (3 pgs).
Proposed Order Proposed Scheduling Order re 16 Memorandum and Order Set Hearings, by SOITEC Silicon on Insulator Technologies SA, Commissariat a LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order,, 16 Memorandum and Order Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon on Insulator Technologies SA, Commissariat a LEnergie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon on Insulator Technologies SA, Commissariat a LEnergie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joinder of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It Is Further Ordered that the Court is holding Sep. 10, Sep. 14 and Sep.

15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).

Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).

Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).

Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a LEnergie Atomique.Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat a L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat a L'Energie Atomique by MEMC Electronic Materials Inc.. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc.. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc..(Rogowski, Patricia) (Entered: Apr. 23, 2009) (4 pgs).

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

Notice of Service of Soitec's First Set of Interrogatories (Nos. 1-17) and Soitec's First Set of Requests for Production of Documents and Things (Nos. 1-132) by SOITEC Silicon on Insulator Technologies SA, Commissariat a LEnergie Atomique. (Attachments: # 1 Certificate of Service)(Kraft, Denise) (Entered: May 6, 2009) (2 pgs).

Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon on Insulator Technologies SA, Commissariat a LEnergie Atomique. (Attachments: # 1 Certificate of Service)(Kraft, Denise) (Entered: May 13, 2009).

Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered- re 38 Stipulation to Extend Time.Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).

Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).

Notice of Service of (1) Soitecs Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a LEnergie Atomique. (Attachments: # 1 Certificate of Service) (Kraft, Denise) (Entered: May 29, 2009).

* cited by examiner

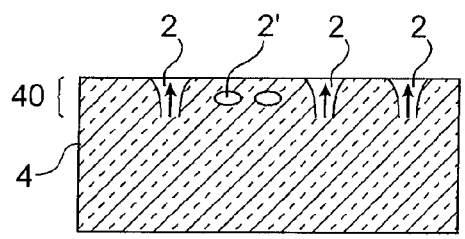 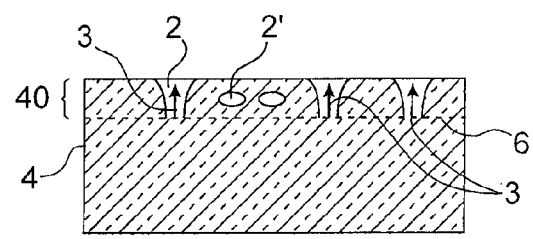
FIG.1A  FIG.1B
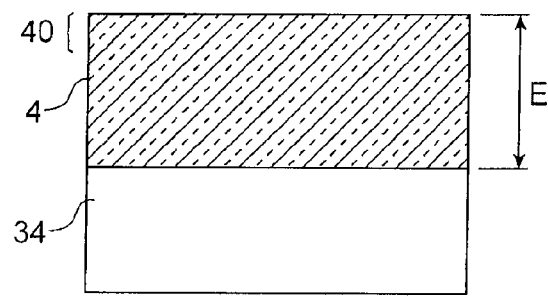 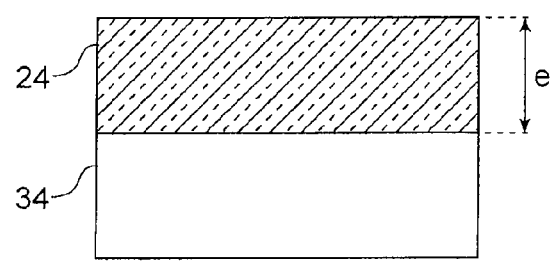
FIG.2A  FIG.2B
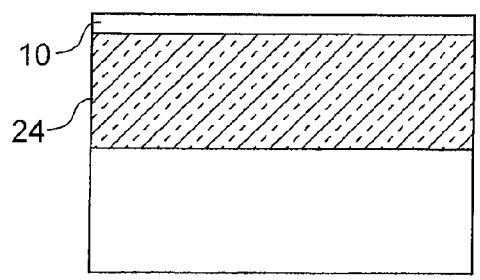 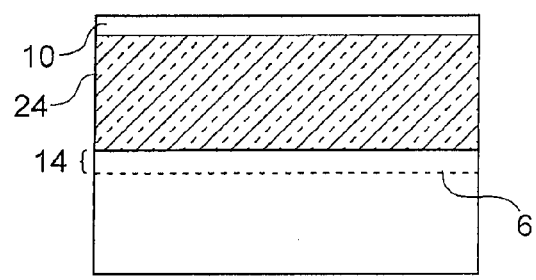
FIG.2C  FIG.2D

PROCESS FOR TRANSFERRING FILMS

RELATED APPLICATIONS

The present patent document claims the benefit of priority to French Patent Application No. 07 59389, filed Nov. 28, 2007, which is incorporated herein by reference.

TECHNICAL FIELD AND PRIOR ART

The invention relates to a process for transferring films from substrates.

Certain materials can be produced by crystalline growth techniques, such as liquid phase epitaxy on a substrate.

This is especially the case for producing high-quality crystalline magnetic garnet films on garnet substrates (GGG, NdGG, SGGG, and the like). GGG refers to a material with the composition $Gd_3Ga_5O_{12}$; NdGG refers to a material with the composition $Nd_3Ga_5O_{12}$; and SGGG refers to a substituted Gadolinium gallate garnet, for example with the composition $Gd_{3-x}Ca_xGa_{5-y-z}Mg_yZr_zO_{12}$.

The liquid phase epitaxy technique makes it possible to produce thick films or substrates on the order of one or more micrometers, and even several dozen micrometers, for example magnetic garnet films containing bismuth and characterised by a strong Faraday rotation effect.

However, in this epitaxy technique, the growth rates are relatively high.

The production of a substrate with a thickness on the order of several dozen micrometers is therefore very delicate because it involves a very short epitaxy time. This makes it necessary to integrate, in this period, the epitaxial bath output times. In addition, the composition of the epitaxially grown substrate portion, produced during the output time, is not homogeneous with the rest of the substrate already developed.

Therefore, there is a high risk of non-homogeneity in the composition of such a substrate, and even a defect in the superficial portion of the epitaxially grown film. The same problem arises in other deposition techniques, for example deposition by laser ablation of a target of which the composition will change, over the course of the ablation, producing a consequential change in the deposition.

SUMMARY

Aside from the problem mentioned above, the inventors demonstrated that, with the known liquid phase epitaxy technique, a structure as shown in FIG. 1A is obtained, with certain crystalline defects 2, of the "traversing" type, present in particular in the superficial portion 40 of the epitaxially grown layer 4. Non-traversing defects 2' are also shown, and are present in particular in the superficial portion of the epitaxially grown layer.

These defects become larger and denser toward the free surface 4' of the film. These defects prevent any use of the superficial portion 40 of the layer, and in particular any transfer of film from this superficial portion onto any substrate.

In addition, as shown in FIG. 1B by the arrows 3, these defects can, for example, serve as exodiffusion channels for gaseous species that would be implanted, for example by ion implantation, in the substrate at a depth 5, depending on the implantation energy, relatively close to the surface 4'. A film corresponding to a superficial portion 40 of the substrate cannot therefore be transferred either, in particular homogeneously, onto a host substrate using an implantation technique, in order to form a fragilisation plane 6 by ion or atom implantation, then by bonding and transfer onto said host substrate.

The same type of problem arises for a layer 4 made of another type of material, developed by epitaxy or by any other known technique, in which said material has defects 2 such as crystalline defects or composition homogeneity defects or other defects in the superficial portion 40', which cannot be used, in particular for transfer to a receiving substrate.

According to the invention, the superficial portion of a layer having or capable of having defects is removed, and the non-removed portion of said layer, initially buried, and a portion of a deposition substrate, are transferred onto a receiving substrate. The initially buried portion of the layer has a homogeneous composition and has few or no defects, or fewer than the removed superficial portion.

The invention therefore relates to a process for forming a layer on a host substrate, comprising:

a) a step of depositing a layer, preferably monocrystalline, onto a deposition substrate, b) a step of thinning said layer in order to form a thinned layer, c) an ion or atom implantation in the deposition substrate, in order to form an implantation zone, d) a transfer of said thinned layer and of the deposition substrate, onto the host substrate, for example made of glass, garnet, sapphire, diamond or ceramic; the transfer can be performed by direct or molecular bonding, e) a fracture of the deposition substrate, along the implantation zone, substantially along a neutral plane of said zone.

The material of the deposited layer is, for example, garnet, in particular magnetic garnet or ferromagnetic garnet doped with bismuth. The deposition substrate can be made of garnet, for example GGG, NdGG or SGGG.

The deposited layer is, for example, a monocrystalline layer epitaxially grown on a monocrystalline deposition substrate.

The deposition technique can be liquid phase epitaxy, but other techniques for depositing this layer are possible, such as deposition by laser ablation of a target, or by cathode sputtering, or by ion beam.

Step b) makes it possible to remove a superficial portion of the deposited layer, which comprises superficial defects and/or composition non-homogeneities, close to the surface. Among these defects, we can cite an enrichment in the composition of elements of a solvent, a relative variation of the elements of a solute, the increase in size and/or density of crystalline defects (for example traversing or non-traversing dislocations, stacking defects, inclusions, precipitates, and the like).

Step b) is performed in order to remove a layer thickness of at least 500 nm. It is noted that the known usual steps of polishing and or activation involve at best a consumption of 30 nm to 50 nm of material, and in any case below 150 nm.

As the initial portion of the deposit is itself partially defective or non-homogeneous, a fragilisation zone is created, not in the deposited layer but in the underlying deposition substrate. The film transferred onto the host substrate then includes a portion of the substrate on which the deposit is produced.

The deposited layer can initially have an initial thickness greater than 1 µm. During step b), this layer is etched or thinned so as to leave only a thickness of it, preferably below 1 µm, or even 500 nm.

Optionally, on the layer obtained after thinning or etching, one or more intermediate layers are deposited, which may or may not be composed of the same material, such as one or more layers for protection and/or assisting the direct bonding, for example a silicon oxide and/or silicon nitride and/or aluminum oxide layer, and the like The ion and/or atom implantation zone can be produced in the deposition substrate, before or after formation of one or more intermediate layers. For example, one or more gaseous species such as hydrogen and/or helium are implanted. This step makes it possible to produce a fragilisation zone or plane in the deposition substrate, at a certain depth.

The surfaces of the thinned layer, to be added and of the host substrate, can be prepared, before step d), for assembly.

Thus, a structure comprising at least the host substrate, the thinned portion of the deposited layer, optionally with at least one intermediate layer between the host substrate and the thinned portion, and a deposition substrate portion is obtained. This latter portion may be eliminated.

If the surface, or a superficial portion, of the initial deposited layer, comprises, before thinning, a certain density, or a first density, of defects of a certain average size, the added thinned layer does not comprise these defects, or comprises a certain density of defects, lower than the first density, and/or defects of smaller size.

The host substrate may comprise one or more functionalities, for example one or more optical components, and/or at least one layer of III-V semiconductor material, or glass having been subjected to a variation in ion concentration, and/or one or more waveguides.

BRIEF DESCRIPTION OF THE DRAWINGS

FIGS. 1A and 1B show a process of the prior art,
FIGS. 2A to 2F show steps of a process according to the invention.

DETAILED DESCRIPTION OF SPECIFIC EMBODIMENTS

Figure 2E:
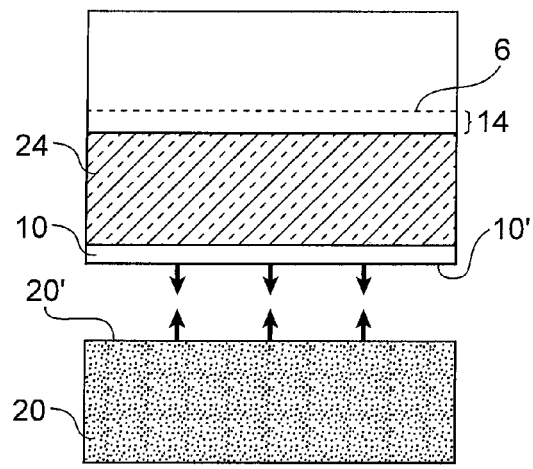

A first example embodiment of the invention is provided in association with FIGS. 2A to 2F.

First, a process of epitaxial growth of a layer 4 is carried out on a growth substrate 34 (FIG. 2A). For example, a layer 4 of ferromagnetic garnet doped with bismuth (for example, with the composition $Bi_{0.8}Tm_{0.25}Gd_{1.45}Pr_{y0.35}$) $(Ga_{0.7}Fe_{4.3})O_{12}$) and epitaxially grown on a non-magnetic substituted Gadolinium gallate garnet substrate 34 (SGGG) is produced. The substrate is substituted in order to have a mesh parameter similar to that of the films to be produced.

The chemical compositions of garnet, SGGG and GGG are those already indicated in the introduction.

The layer 4 obtained can have a thickness E, for example on the order of 1 μm or more, for example 2 μm or 5 μm. The defects of type 2, 2' (FIG. 1A) are not shown in this figure, but are present or may be present, in particular in a superficial portion 40. Therefore, a thinning of the layer 4 is performed, for example by chemical mechanical polishing and/or chemical attack. The superficial portion 40 of the substrate is thus removed.

The thickness e of the thinned layer 24 obtained (FIG. 2B) is then lower than the initial thickness. It is, for example, below 1 μm, on the order of several hundred nm, for example even below 500 nm, such as 300 nm.

A deposition of one or more intermediate layers 10 (for example a silicon oxide and/or silicon nitride) can then be performed (FIG. 2C). The various intermediate layer(s) can have different functions. This layer, or some of these layers, will serve as protection, for example to limit the exodiffusion of species that will subsequently be implanted (this is the case, for example, of a layer 10 of SiN), whereas the layer or other layers (for example a layer 10 of $SiO_2$) will facilitate the subsequent direct bonding.

Next (FIG. 2D), an atom and/or ion implantation is carried out, in order to form a fragilisation zone or plane 6 in the growth substrate 34. This fragilisation zone will subsequently make it possible to separate, from the rest of the substrate 34, a thin layer 14 that includes layer 24 and, optionally, one or more intermediate layers 10, which have one or more of the functions indicated above.

Alternatively, it is possible to reverse the order of the steps of implantation in the growth substrate 34 and deposition of the intermediate layers 10: the implantation is performed in the substrate 34 before the layer(s) 10 are produced.

The depth of implantation in the substrate 34 is dependent in particular on the implantation energy. This depth can, for example, be predetermined by the SRIM simulation software program; see, for example "The Stopping and Range of Ions in Solids", by J. F. Ziegler, J. P. Biersack and U. Littmark, Pergamon Press, New York, 1985 and the contribution of J. F. Ziegler in www.SRIM.org.

The implantation doses will be, for example, in a range from $1\times10^{16}$ $cm^{-2}$ to $4\times10^{17}$ $cm^{-2}$.

For example, for a helium implantation alone, the implantation dose is preferably between $5\times10^{16}$ $cm^{-2}$ and $2\times10^{17}$ $cm^{-2}$. It is advantageously equal to, or on the order of, $7.10^{16}$ $cm^{-2}$.

For a hydrogen implantation alone, it is preferably between $5\times10^{16}$ $cm^{-2}$ and $3\times10^{17}$ $cm^{-2}$ and advantageously between $7\times10^{16}$ $cm^{-2}$ and $1.5\times10^{17}$ $cm^{-2}$.

The surface 20' of a host substrate 20 can then be prepared, by chemical cleaning (FIG. 2E). The same is true of the surface of layer 24, optionally the free surface 10' of the outermost layer 10. The surface 20' can also be equipped with a layer (not shown in FIG. 2E) for assisting with bonding.

The host substrate 20 preferably has a thermal expansion coefficient equal to, or relatively close to that of layer 24 to be transferred (or of substrate 34). The host substrate 20 can, for example, be glass, with a thermal expansion coefficient greater than $2\ 10^{-6}/K$, for example $5\ 10^{-6}/K$, or (if the layer to be transferred 24 is garnet) another garnet, or sapphire, or diamond, or ceramic, for example alumina, and the like The host substrate can be covered with a bonding layer, for example a deposited $SiO_2$ layer. These materials are particularly suitable in the case of a transfer of a layer 24 from a garnet growth substrate 34.

The host substrate can contain a layer (for example made of a III-V semiconductor material, or of glass having been subjected to a variation in ion concentration), capable of supporting a compound, for example for integrated optics applications. Also by way of an example, the host substrate can contain waveguides.

The layer 24 is then transferred to the host substrate (FIG. 2E), by its free face or by the free face of the layer 10, via direct or molecular bonding.

The fracture along the fragilisation plane 6 can then be performed, for example by a heat treatment within the range of 300° C. to 600° C. and advantageously within the range of 400° C. to 500° C., generally for a period of several minutes to several hours, depending, in particular, on the temperature of the heat treatment. For example, the period is 5 hours at 490° C. for a helium implantation.

This fracture is, for example, of the type performed in the Smart Cut™ process. This process is described in the article of B. Aspar and A. J. Auberton-Hervé in "Silicon Wafer Bonding Technology for VLSI and MEMS applications", edited by S. S. Iyer and A. J. Auberton-Hervé, 2002, INSPEC, London, Chapter 3, pages 35-52.

This fracture will make it possible to transfer the layer 24, which can itself be partially defective or non-homogeneous (but less so than the superficial portion 40 that has been removed), avoiding risks such as those described above in association with FIGS. 1A and 1B, in particular the risk of exodiffusion of implanted species.

Figure 2F:
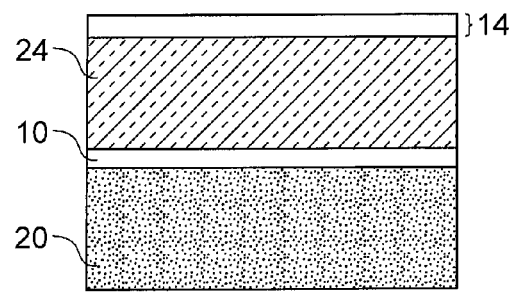

The structure obtained, shown in FIG. 2F, comprises, in addition to the transfer substrate 20, one or more possible intermediate layer(s) 10, for example for protecting and/or assisting with the direct bonding, and the film or the layer 24. Coming from a zone of the initial layer 4 having few or no defects such as the defects 2, the transferred layer 24 has fewer defects and/or smaller defects than the superficial portion 40, which has been removed.

Then, the layer 14 resulting from the growth substrate 34 is removed. The interfaces can be consolidated by heat treatments.

The two examples provided below will describe the transfer of a garnet layer 24 onto a glass substrate 20.

In the first example, the epitaxy of a garnet layer 4 is first carried out (FIG. 2A). The thickness of the layer 4 thus epitaxially grown is on the order of E equal to 1.8 µm just after epitaxy.

After chemical mechanical polishing and chemical thinning, in order to remove the most defective or least homogeneous portion of the film, an epitaxial layer 24 with a thickness e of around 350 nm remains (FIG. 2B).

Two depositions 10 are then performed in succession, first a deposition of 50 nm of SiN, then a deposition of 200 nm of $SiO_2$, at 300° C.

The implantation is a helium implantation, at a dose of $7 \times 10^{16}$ $He^+.cm^{-2}$, with an energy of 200 keV (FIG. 2D). These implantation conditions make it possible to produce a fragilisation zone at a depth of around 200 nm in the initial epitaxy substrate 34. In this case, a SGGG substrate 34 is used. A mechanical-chemical polishing operation is performed on the $SiO_2$ layer 10, then a surface cleaning of this same polished layer is performed. A thickness of 50 nm of $SiO_2$ remains.

The surface 20' of the receiving host substrate 20 is cleaned. The surface of the superficial $SiO_2$ layer is assembled by direct bonding with said surface 20'.

Finally, a heat treatment, for 5 hours, at 490° C., makes it possible to fracture the substrate 34 (FIG. 2F).

The total thickness transferred to the host substrate 20 is around 640 nm. It corresponds to the following assembly (FIG. 2F):

layer $SiO_2$ 10/layer SiN 10/layer of ferromagnetic garnet 24/layer of SGGG 14, since the fragilised zone is in the growth substrate 34.

In the second example, the epitaxy of a garnet layer 4 (FIG. 2A), with a thickness E=1.8 µm after epitaxy, is first carried out on a SGGG substrate 34.

After chemical mechanical polishing and chemical thinning, a layer 4' with a thickness e equal to around 300 nm remains.

A deposition 10 of 80 nm of $SiO_2$ is then performed.

The implantation is a hydrogen ion implantation, at a dose of $1 \times 10^{17}$ $H^+.cm^{-2}$, with an energy of 210 keV (FIG. 2C). For such implantation conditions, a fragilisation at a depth of around 1 µm is caused in the initial epitaxial substrate 34. Depending on the type of oxide deposited and its surface roughness, the surface of the $SiO_2$ layer 10 is prepared by a chemical mechanical polishing step (CMP), then the surface of this same polished layer is cleaned in order to make it suitable for a subsequent direct bonding. A thickness of 50 nm of $SiO_2$ remains.

A cleaning of this same layer is performed.

The surface 20' of the receiving substrate 20 is cleaned. On this surface, the layer 10 of $SiO_2$ is assembled by direct bonding (FIG. 2E).

Finally, a heat treatment, for 4 hours, at 450° C., makes it possible to fracture the substrate 34 (FIG. 2E).

The total thickness transferred to the host substrate 20 is around 1.35 µm. It corresponds to an assembly of $SiO_2$ layer 10/magnetic garnet layer 24/SGGG layer 14, since the fragilised zone is in the growth substrate 34.

The invention applies more generally to any transfer of a buried portion of a crystalline layer of which the superficial portion can be "degraded" in a deposition operation (by any epitaxy technique or by another process) and/or during treatment operations following the deposition. The degradation can involve a final portion of growth of the layer having more defects or larger defects than in the initial portion of the deposition, and/or a modification of the composition in the superficial portion, related to the deposition method used, and/or inclusions and/or precipitates in said superficial portion of the layer.

In all of these cases, the superficial portion is removed or sacrificed, and the steps described above in association with FIGS. 2C to 2F are carried out.

Among the deposition techniques other than liquid phase epitaxy, which are concerned by the present invention, we can cite laser ablation, cathode sputtering, ion beam, and the like. These techniques can produce composition non-homogeneities or an increase in defects, in the portion closest to the free surface of the deposited layer, during the deposition or after it. The layers deposited by these techniques do not therefore enable the direct transfer onto a transfer substrate, and, according to the present invention, the superficial portion is removed before the above steps associated with FIGS. 2C to 2F are carried out.

Figure 3:
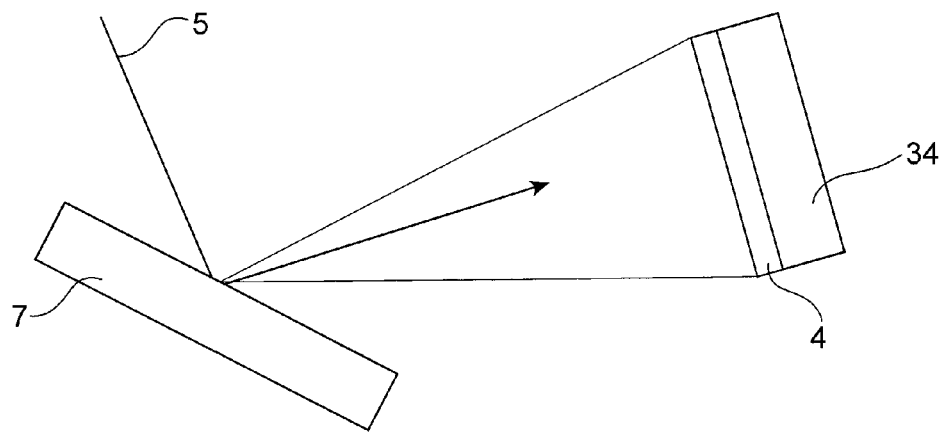
FIG. 3 shows a technique for deposition by laser ablation.

Thus, FIG. 3 shows the production of a layer 4 on a deposition substrate 34, by ablation by laser beam 5 of a target 7. The composition of the latter will change over time, since the action of the beam 5 will include effects thereon such as a progressive fusion of the material of the target or other effects. The target 7, from which the layer 4 is formed, changes, as does composition of the layer 4. Again, the invention makes it possible to overcome this problem by removing an upper portion of the layer 4 and by transferring the remainder 24 of this layer and a portion of the substrate 34, as explained above in association with FIG. 2F, after ion implantation in the substrate 34.

The invention claimed is:

1. A process for forming a layer on a host substrate, the process comprising:
   a) depositing a monocrystalline layer onto a deposition substrate to form a deposited layer, comprising a superficial portion having a first defect density, the defects comprising crystalline defects or composition homogeneity defects, and a buried portion, having fewer defects than the superficial portion;
   b) thinning the deposited layer by removing the superficial portion and allowing the buried portion to remain to form a thinned layer, wherein thinning the deposited layer comprises removing at least 500 nm of material from the monocrystalline layer, and wherein the thinned layer has a second defect density that is less than the first defect density;

c) implanting ions or atoms in the deposition substrate after thinning the deposited layer to form an implantation zone;
d) transferring the thinned layer onto the host substrate; and
e) fracturing the deposition substrate along the implantation zone.

2. The process according to claim 1 further comprising, before step c), or before step d), a step of forming at least one intermediate layer.

3. The process according to claim 2, wherein forming at least one intermediate layer comprises forming one of more layers of silicon oxide, silicon nitride, or aluminum oxide.

4. The process according to claim 1, wherein implanting ions or atoms comprises implanting a dose between $1\times10^{16}$ cm$^{-2}$ and $4\times10^{17}$ cm$^{-2}$.

5. The process according to claim 1, wherein the host substrate comprises one of glass, garnet, sapphire, diamond or ceramic.

6. The process according to claim 1, wherein the host substrate further includes a layer to assist with bonding.

7. The process according to claim 1, wherein the deposited layer has a thickness greater than 1 μm before step b), and the thinned layer has a thickness below 1 μm after step b).

8. The process according to claim 1, wherein depositing a monocrystalline layer comprises epitaxial growth of the layer on the deposition substrate.

9. The process according to claim 1, wherein depositing a monocrystalline layer comprises one of liquid phase epitaxy, deposition by laser ablation of a target, cathode sputtering, or ion beam sputtering.

10. The process according to claim 1, wherein the material of the deposited layer comprises garnet.

11. The process according to claim 1, wherein the material of the deposited layer comprises ferromagnetic garnet doped with bismuth.

12. The process according to claim 10 or 11, wherein the deposition substrate comprises GGG, NdGG or SGGG.

13. The process according to claim 1, wherein transferring the thinned layer comprises direct or molecular bonding.

14. The process according to claim 1, wherein the host substrate includes one or more optical components.

15. The process according to claim 1, wherein the host substrate includes one or more waveguides.

16. The process according to claim 1, wherein the host substrate comprises a layer of III-V semiconductor material or glass having a variation in ion concentration.

17. A process for forming a layer of garnet on a host substrate, the process comprising:

a) depositing a monocrystalline layer of garnet onto a deposition substrate to form a deposited layer comprising a superficial portion having a first defect density, the defects comprising crystalline defects or composition homogeneity defects, and a buried portion having fewer defects than the superficial portion;
b) thinning the deposited layer, such that a superficial portion of material having a thickness at least 500 nm is removed, and allowing the buried portion to remain, forming a thinned layer, wherein the thinned layer has a second defect density that is less than the first defect density;
c) implanting ions or atoms in the deposition substrate after thinning the deposited layer to form an implantation zone;
d) transferring the thinned layer onto the host substrate, the host substrate comprising glass, garnet, sapphire, diamond, or ceramic; and
e) fracturing the deposition substrate along the implantation zone.

18. A process for forming a layer on a host substrate, the process comprising:

a) depositing a monocrystalline layer onto a deposition substrate to form a deposited layer, comprising a superficial portion having a first defect density, the defects comprising crystalline defects or composition homogeneity defects, and a buried portion, having fewer defects than the superficial portion;
b) thinning the deposited layer by removing the superficial portion and allowing the buried portion to remain to form a thinned layer, wherein the thinned layer has a thickness of less than about 1 micron and a second defect density that is less than the first defect density;
c) implanting ions or atoms in the deposition substrate after thinning the deposited layer to form an implantation zone;
d) transferring the thinned layer onto the host substrate; and
e) fracturing the deposition substrate along the implantation zone.

19. The process according to claim 18, wherein the deposited layer has a thickness greater than 1 μm before step b), and the thinned layer has a thickness below 1 μm after step b).

20. The process according to claim 18, wherein transferring the thinned layer comprises direct or molecular bonding.

21. The process according to claim 18, wherein thinning the deposited layer comprises removing at least 500 nm of material from the monocrystalline layer.

* * * * *